United States Patent
Kumar et al.

(10) Patent No.: US 11,182,243 B2
(45) Date of Patent: Nov. 23, 2021

(54) MEMORY SYSTEM WITH ADAPTIVE INFORMATION PROPAGATION AND METHOD OF OPERATING SUCH MEMORY

(71) Applicant: SK hynix Inc., Gyeonggi-do (KR)

(72) Inventors: Naveen Kumar, San Jose, CA (US); Aman Bhatia, San Jose, CA (US); Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/274,981

(22) Filed: Feb. 13, 2019

(65) Prior Publication Data
US 2019/0250986 A1     Aug. 15, 2019

Related U.S. Application Data

(60) Provisional application No. 62/631,257, filed on Feb. 15, 2018.

(51) Int. Cl.
  *G06F 11/10*  (2006.01)
  *H03M 13/11*  (2006.01)
  *G11C 29/52*  (2006.01)
  *G11C 29/12*  (2006.01)

(52) U.S. Cl.
  CPC .......... *G06F 11/1068* (2013.01); *G11C 29/52* (2013.01); *H03M 13/1111* (2013.01); *H03M 13/1128* (2013.01); *G11C 2029/1202* (2013.01)

(58) Field of Classification Search
  CPC .......... G06F 11/1068; G06F 11/1012; H03M 13/1128; H03M 13/1111; G11C 29/52; G11C 2029/1202
  USPC .......................................................... 714/764
  See application file for complete search history.

(56) References Cited

U.S. PATENT DOCUMENTS

| | | | | |
|---|---|---|---|---|
| 8,352,840 | B2 * | 1/2013 | Crozier | H03M 13/296 714/780 |
| 8,495,479 | B1 * | 7/2013 | Varnica | H03M 13/1111 714/780 |
| 8,739,009 | B1 * | 5/2014 | Varnica | G11B 20/1833 714/746 |
| 8,769,380 | B1 * | 7/2014 | Burd | H03M 13/1128 714/774 |
| 9,184,767 | B2 * | 11/2015 | Vernon | H03M 13/1108 |
| 9,461,863 | B2 | 10/2016 | Vojcic et al. | |
| 9,509,342 | B2 | 11/2016 | Vernon | |
| 10,446,253 | B2 | 10/2019 | Choi | |
| 10,515,712 | B1 | 12/2019 | Hsiao et al. | |
| 10,529,432 | B2 | 1/2020 | Park | |

(Continued)

OTHER PUBLICATIONS

Notice of Allowance issued by the USPTO for the U.S. Appl. No. 16/575,224 dated Dec. 4, 2020.

*Primary Examiner* — James C Kerveros
(74) *Attorney, Agent, or Firm* — IP & T Group LLP

(57) ABSTRACT

Systems, memory controllers, decoders and methods perform decoding by exploiting differences among word lines for which soft decoding fails (failed word lines). Such decoding generates extrinsic information for codewords of failed word lines based on the soft decoding. The soft information obtained during the soft decoding is updated based on the extrinsic information, and the updated soft information is propagated across failed word lines. Low-density parity-check (LDPC) decoding of codewords of failed word lines is performed with the updated soft information.

14 Claims, 7 Drawing Sheets

(56) References Cited

U.S. PATENT DOCUMENTS

| | | |
|---|---|---|
| 2013/0061107 A1 | 3/2013 | Wang et al. |
| 2014/0059401 A1 | 2/2014 | Chung et al. |
| 2019/0155688 A1 | 5/2019 | Kumar et al. |
| 2019/0250986 A1 | 8/2019 | Kumar et al. |
| 2020/0358459 A1 | 11/2020 | Haga |

* cited by examiner

MEMORY SYSTEM WITH ADAPTIVE INFORMATION PROPAGATION AND METHOD OF OPERATING SUCH MEMORY

CROSS-REFERENCE TO RELATED APPLICATION

This application claims the benefit of U.S. Provisional Application No. 62/631,257, filed Feb. 15, 2018, the entire content of which is incorporated herein by reference.

BACKGROUND

1. Field

Embodiments of the present disclosure relate to a memory system with a scheme to adaptively propagate information to improve decoding, and method of operating such memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller may include an embedded processor that executes functional components such as firmware. The SSD functional components are typically device specific, and in most cases, can be updated.

The two main types of flash memories are named after the NAND and NOR logic gates. The individual flash memory cells exhibit internal characteristics similar to those of their corresponding gates. The NAND-type flash memory may be written to and read from in blocks (or pages) which are generally much smaller than the entire memory space. The NOR-type flash allows a single machine word (byte) to be written to an erased location or read independently. The NAND-type flash memory operates primarily in memory cards, USB flash drives, solid-state drives (SSDs), and similar products, for general storage and transfer of data.

A flash memory, e.g., of the NAND-type, may apply any of various error correction codes to correct errors in data. One such error correction code is low-density parity-check code (LDPC), which is an advanced error code that is used to recover a relatively large number of errors in data. Soft information is generated during the LDPC decoding process. In this context embodiments of the present invention arise.

SUMMARY

Aspects of the present invention include memory systems and components thereof such as memory controllers and decoders.

In one aspect, a memory system comprises a memory device including a super block, and a memory controller. The memory controller is configured to perform soft decoding of all word lines in the super block to generate respective codewords; generate extrinsic information for codewords of word lines for which soft decoding failed (failed word lines) based on the soft decoding; update soft information obtained during the soft decoding based on the extrinsic information; propagate the updated soft information across at least some of the failed word lines; and perform low-density parity-check (LDPC) decoding of codewords of failed word lines with the updated soft information.

In another aspect, a memory controller comprises a low-density parity-check (LDPC) decoder. The LDPC decoder is configured to perform soft decoding of all word lines in a super block to generate respective codewords; generate extrinsic information for codewords of word lines for which soft decoding failed (failed word lines) based on the soft decoding; update soft information obtained during the soft decoding based on the extrinsic information; propagate the updated soft information across at least some of the failed word lines; and perform low-density parity-check (LDPC) decoding of codewords of failed word lines with the updated soft information.

Further aspects of the present invention include methods, particularly methods of decoding, which may be performed by memory controllers and components thereof, such as decoders. In this regard, another aspect of the present invention, entails a method of decoding. The decoding method comprises performing soft decoding of all word lines in a super block of a memory device to generate respective codewords; generating extrinsic information for codewords of word lines for which soft decoding failed (failed word lines) based on the soft decoding; updating soft information obtained during the soft decoding based on the extrinsic information; propagating the updated soft information across at least some of the failed word lines; and performing low-density parity-check (LDPC) decoding of codewords of failed word lines with the updated soft information.

Additional aspects of the present invention will become apparent from the following description.

DETAILED DESCRIPTION

Figure 1:
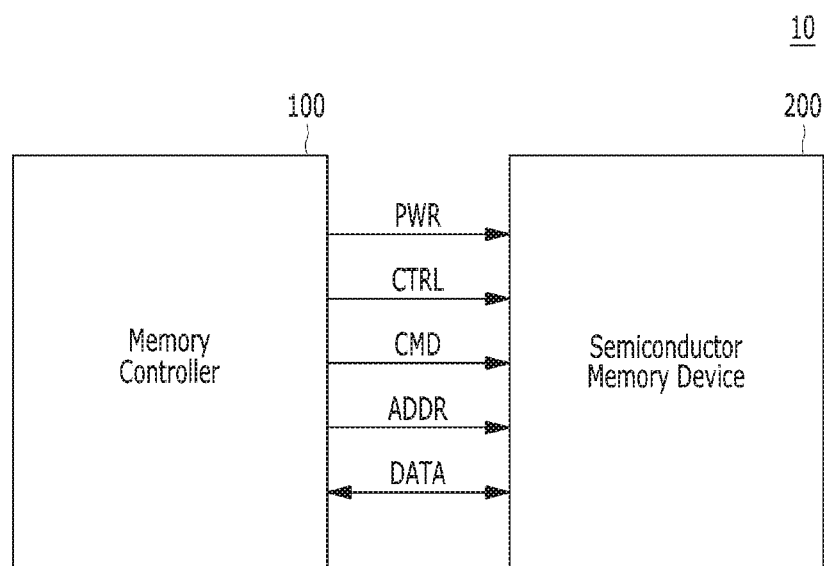
FIG. 1 is a block diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrases are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring FIG. 1, the memory system 10 may include a memory controller 100 and a semiconductor memory device 200, which may represent more than one such device. The semiconductor memory device(s) 200 may be flash memory device(s), particularly of the NAND-type.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
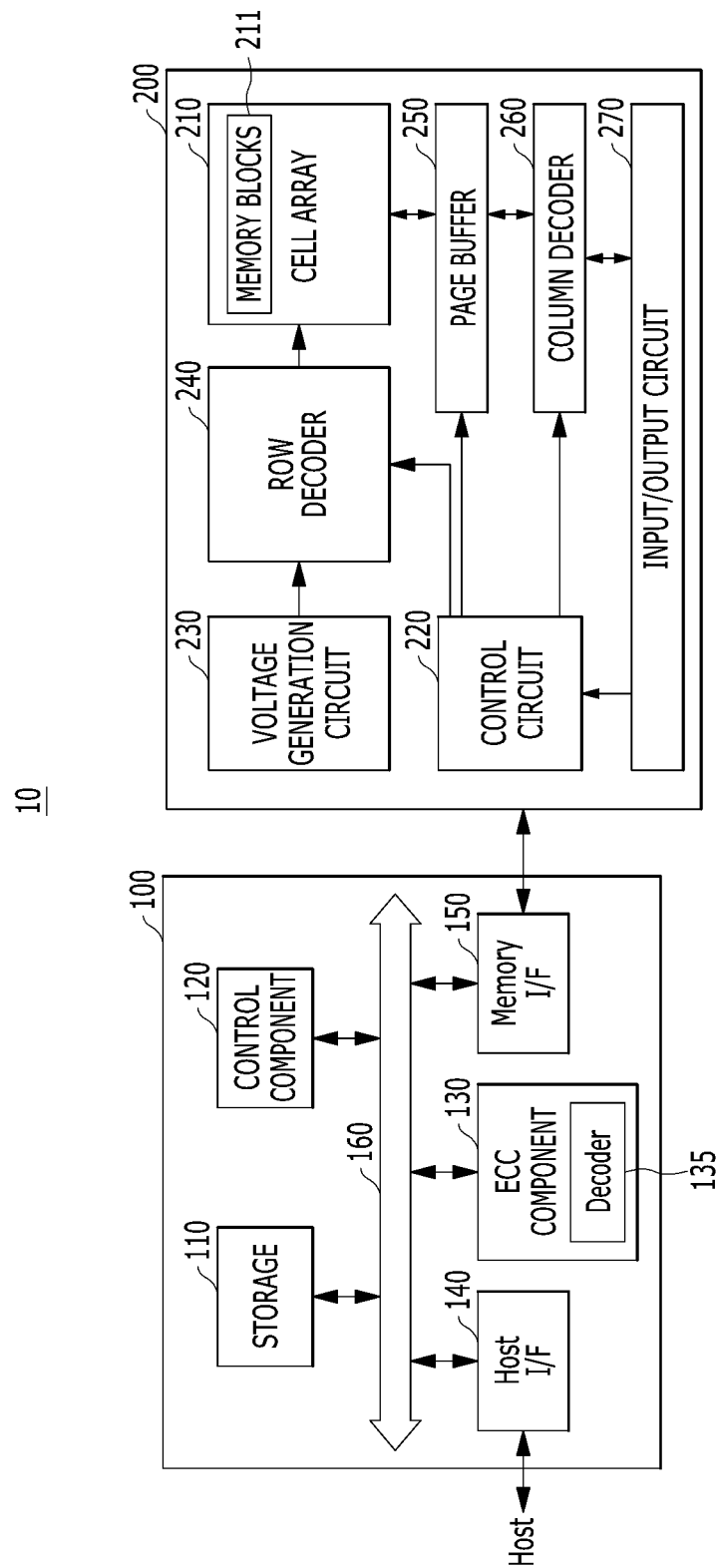
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The memory controller 100 may control storage of data in the memory device 200. For example, the memory controller 100 may control the memory device 200 in response to a request from the host device. The memory controller 100 may provide data read from the memory device 200 to the host device, and may store data provided from the host device into the memory device 200.

The memory controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the memory controller 100, and store data for driving the memory system 10 and the memory controller 100. When the memory controller 100 controls operations of the memory device 200, the storage 110 may store data used by the memory controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In embodiments, the ECC component 130 may perform an error correction operation based on a coded modulation such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a block coded modulation (BCM). As such, the ECC component 130 may include all circuits, systems or devices for suitable error correction operation.

In particular, the ECC component 130 may include an encoder and a decoder 135, e.g., an LDPC decoder and more particularly, an LDPC chip-kill decoder. As explained in more detail below, the ECC component 130 including the decoder 135 are configured to propagate soft information across failed word lines and provide a metric that incorporates iteration and unsatisfied check (USC) information to generate extrinsic information at each iteration.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the memory controller 100 and the memory device 200 to allow the memory controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
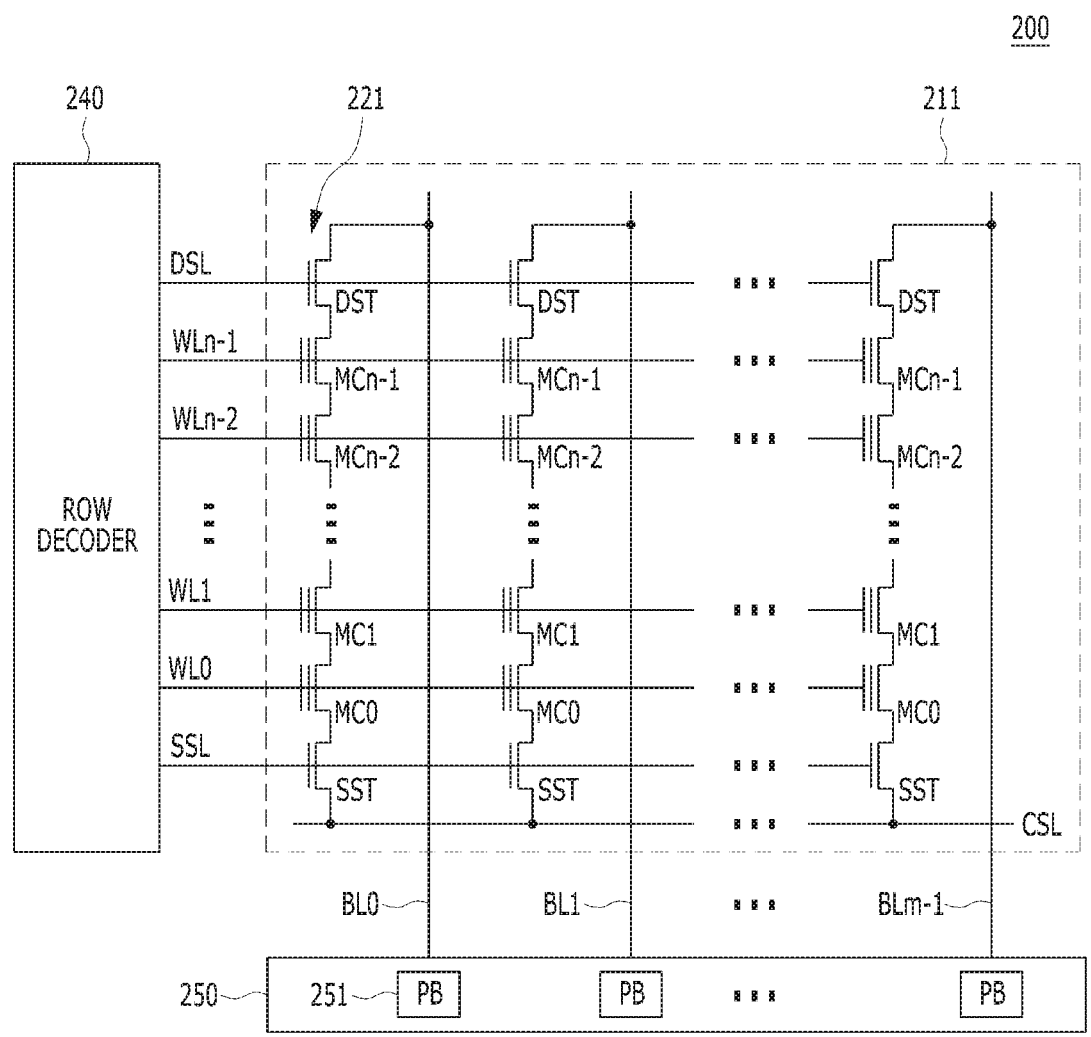
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
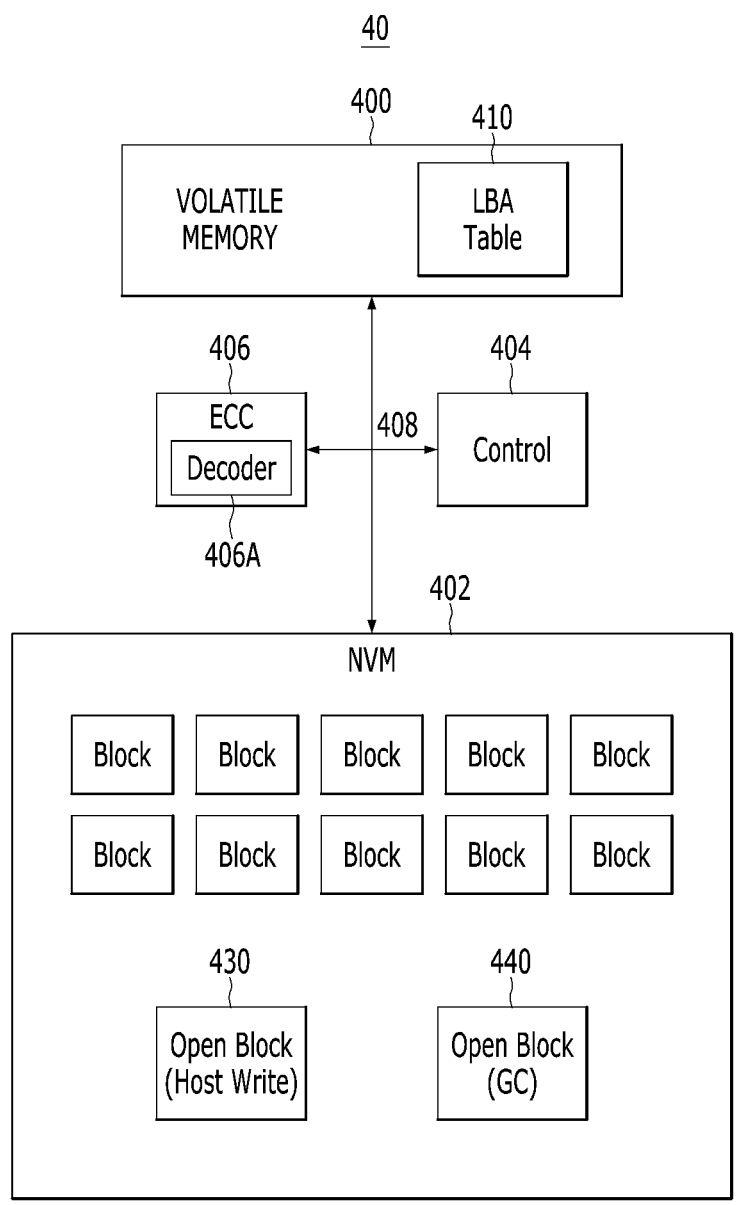
FIG. 4 is a schematic diagram of a memory system in accordance with an embodiment of the present invention.

Referring to FIG. 4, a general example of a memory system 40 is schematically illustrated. The memory system 40 may include a volatile memory 400 (e.g., a DRAM), a non-volatile memory (NVM) 402 (e.g., NAND), a control component or control logic 404, such as described herein, an error correcting code (ECC) module 406, such as described herein, and a bus 408 through which these components of the memory system 40 communicate. The volatile memory 400 may include a logical bit address (LBA) table 410 for mapping physical-to-logical addresses of bits. The NVM 402 may include a plurality of memory blocks which may be grouped into super memory blocks, as well as an open block for host writes 430 and an open block for garbage collection (GC) 440. Multiple memory blocks may be grouped together as a super block for certain functional purposes.

The ECC module 406 may include a decoder 406A, e.g., an LDPC decoder and more particularly, an LDPC chip-kill decoder. The ECC module 406 including its decoder 406A may be used to carry out aspects of the present invention. Additional/alternative components that may be utilized with memory systems to effectuate the present invention will be understood to those of skill in the art in light of this disclosure.

Presently, in an error recovery scheme soft information may be updated based on the chip-kill parity. However, after LDPC decoding, soft information is not utilized judiciously. Ideally, the reliability of extrinsic information should be adaptively adjusted based on the iteration and unsatisfied check (USC) information.

Embodiments of the present invention are directed to addressing this issue. To that end, embodiments of the present invention provide configurations and processing frameworks to propagate soft information across failed word lines and provide a metric that incorporates iteration and USC information to generate extrinsic information at each iteration. Such configurations and frameworks provide significant performance gains.

The chip-kill scheme is implemented such that the XOR of the data (codewords) of all word lines in a super block is stored in the last word line of the super block. In the recovery procedure, hard decoding of all word lines is done to recover data of a failed word line after LDPC decoding. If there is only one word line failure, it is straight forward to recover the data for the failed word line by using the XOR of the data of all successfully decoded word lines. The problem becomes challenging when there are multiple word lines failing from LDPC soft decoding. Even though the failed word lines are in the same super block, there can be a significant variation in the bit error rate (BER).

Aspects of the present invention advantageously exploit such variation in passing extrinsic information to failed word lines. Another aspect of the present invention recognizes that some failed word lines can converge faster in LDPC decoding, and thus provides higher weights or scaling factors to extrinsic information of these failed word lines while still propagating soft information across other failed word lines.

In describing embodiments of the present invention, the following notations are used.

$N_w+1$ denotes the number of word lines in a super block. $N_f$ denotes the number of failed word lines after LDPC soft decoding. $USC_k^{(i)}$ denotes the number of unsatisfied checks for the $k^{th}$ word line at the $i^{th}$ iteration. $C_k$ denotes the codeword written on the $k^{th}$ word line. $C_{XOR}$ denotes the codeword written on the last word line.

The linearity of LDPC enforces the following constraint on the codeword written of the last word line:

$$C_{XOR} = \oplus_{k=1}^{N_w} C_k \in \Omega,$$

where $\Omega$ is the LDPC codebook space.

This further implies:

$$\oplus_{k=1}^{N_w} C_k \oplus C_{XOR} = 0 \qquad (1)$$

Figure 5:
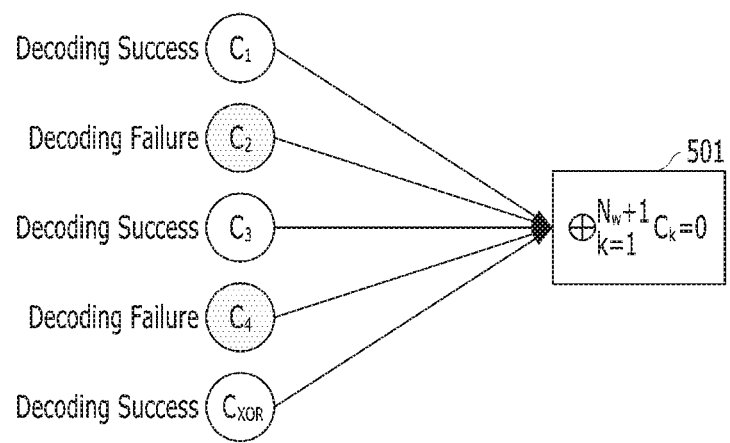
FIG. 5 is a schematic diagram showing a check constraint on all codewords written in a super block of a memory device in accordance with an embodiment of the present invention.

The above constraint is illustrated in FIG. 5, where, by way of example, the value of $N_w$ is taken to be 4 and the number of failed word lines $N_f$ is taken to be 2. FIG. 5 shows the check constraint on all codewords written in a super block, where each codeword $C_1$ to $C_4$ is designated by a circle and the rectangle 501 represents check constraint (1). In the embodiment of FIG. 5, codewords $C_1$ and $C_3$ were successfully decoded, and codewords $C_2$ and $C_4$ were not successfully decoded.

In some embodiments, the extrinsic information for failed word lines may be weighted or scaled. In an embodiment, such scaling be implemented with $\alpha_k$ given as:

$$\alpha_k = f(\text{iteration}, \text{USC}_k^{(i)}) \quad (2)$$

In equation (2), $\alpha_k$ is the scaling factor for the extrinsic information of the $k^{th}$ word line and $k \in [1, N_w+1]$. Intuitively, the $f(\ )$ function may be selected such that it does not scale information with USC=0, whereas it scales down extrinsic information for any word line with a higher USC. That is, the scaling factor determined according to equation (2) may scale according to USC information obtained at each iteration. In an embodiment, the scaling factor depends upon USC and iteration information as observed from equation (2).

In another embodiment, the scaling factor may be determined heuristically. An offline table can be generated heuristically based on simulation results which maximizes the performance. This optimized table can predict scaling factors based upon USC and iteration.

Figure 6:
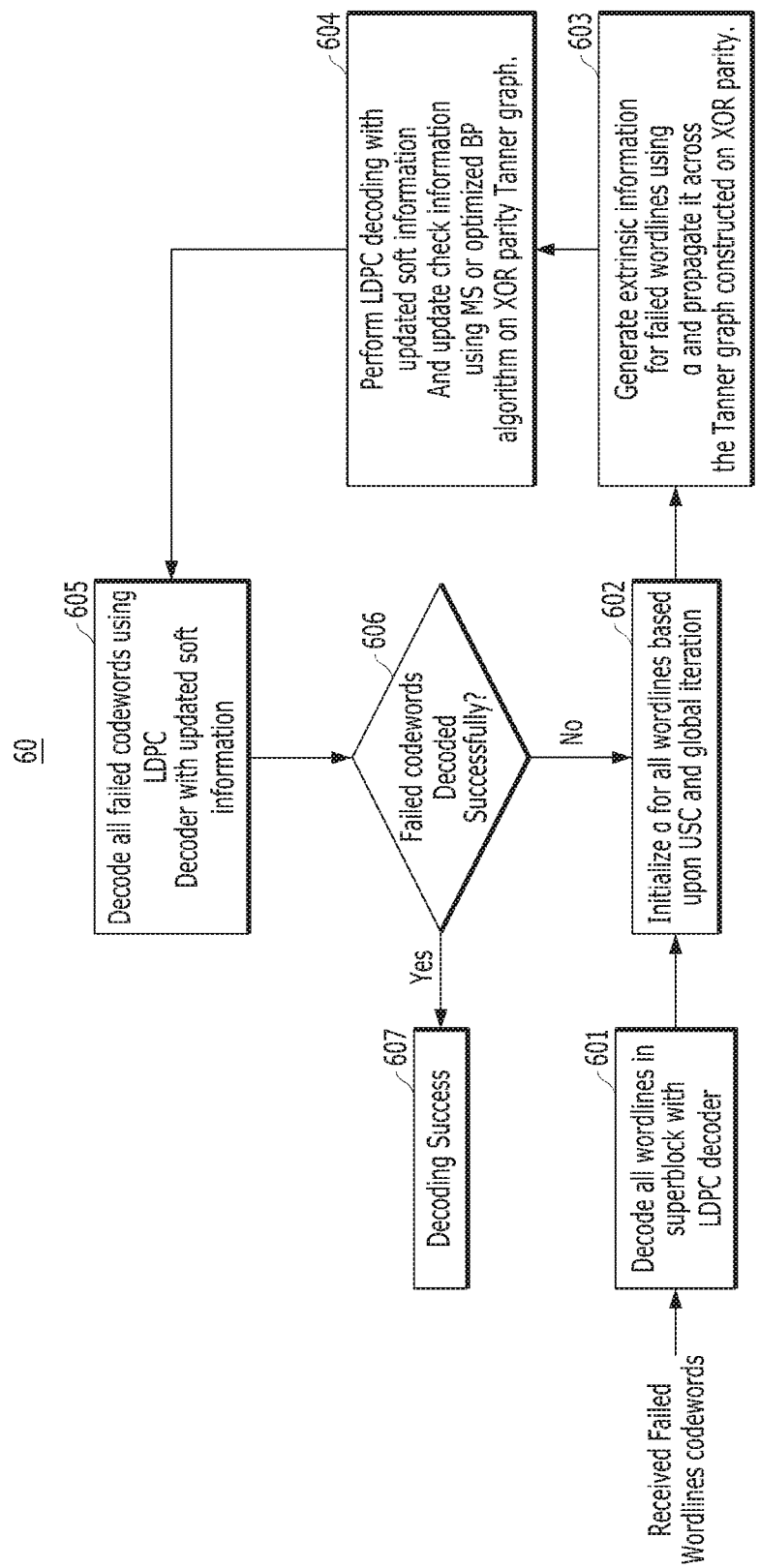
FIG. 6 is a flow chart of a decoding scheme in accordance with an embodiment of the present invention.

The decoding flow in accordance with embodiments is illustrated in flow chart 60 shown in FIG. 6. The decoding may be performed by the LDPC decoder 135 or 406A within the ECC component 130 or ECC module 406 respectively, and may operate in conjunction with other components of the memory controller 100.

Referring to FIG. 6, in conjunction with other figures, the LDPC decoder receives codewords of failed word lines, that is data that was not previously successfully decoded. At step 601, all word lines in a super block are decoded with the LDPC decoder. At step 602, a scaling factor α is initialized for all word lines based on USC and global iteration. At step 603, extrinsic information for failed word lines is generated using α and propagated across the Tanner graph constructed on XOR parity. At step 604, LDPC decoding is performed with updated soft information, which includes propagated extrinsic information. Also, check information is updated using a suitable min-sum (MS) or belief propagation (BP) algorithm on the XOR parity Tanner graph. At step 605, all failed codewords are decoded using the LDPC decoder with updated soft information. Next, at step 606, it is determined whether the failed codewords are converging. If so (Yes at step 606), the decoding is deemed successful at step 607, in which case the decoding ends. If not (No at step 606), the decoding flow returns to step 602 for another iteration. In subsequent iterations, the scaling factor α is updated based on USC information and iteration at step 602, and the current scaling factor α is used in that iteration.

Figure 7:
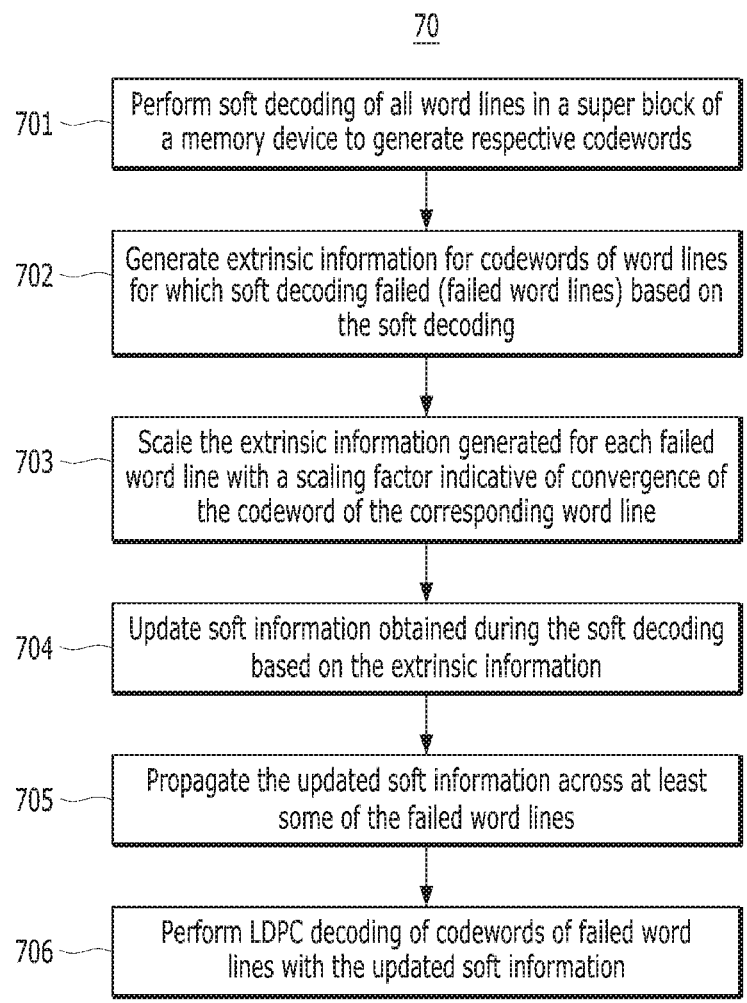
FIG. 7 is a flow chart illustrating steps in processes for decoding in which soft information is propagated across failed word lines in chip-kill recovery in accordance with embodiments of the present invention.

FIG. 7 is a flow chart describing steps in processes for decoding in which soft information is propagated across failed word lines in chip-kill recovery, in accordance with embodiments of the present invention. The steps shown in flow chart 70 are exemplary. Those skilled in the art will understand that additional and/or alternative steps may be performed, or that the order of steps may be changed, to effectuate aspects of the present invention without departing from the inventive concepts disclosed herein. The steps of flow chart 70 may be performed by the memory controller 100 or suitable components thereof, such as the LDPC decoder 135/406A, any of which may be implemented with appropriate hardware, software, firmware or combination thereof.

Referring to FIG. 7, at step 701, soft decoding is performed on all word lines in the super block to generate respective codewords. That is, a codeword is generated for each word line. At step 702, extrinsic information is generated for codewords of word lines for which soft decoding failed (failed word lines) based on the soft decoding. At step 703, extrinsic information generated for each failed word line is appropriately scaled. In an embodiment, a scaling factor may be used. The magnitude or weight of the scaling factor may be indicative of convergence of the codeword of the corresponding word line. That is, codewords that are converging faster may be scaled more or weighted higher to reflect this occurrence.

Next, at step 704, soft information obtained during the soft decoding is updated based on the extrinsic information. At step 705, the updated soft information is propagated across at least some of the failed word lines, and preferably all of the failed word lines. Such updated and propagated soft information is then used at step 706 to perform low-density parity-check (LDPC) decoding of codewords of failed word lines.

As the foregoing demonstrates, embodiments of the present invention provide techniques for judiciously propagating soft information across failed word lines in chip-kill recovery and provide a metric that incorporates iteration and USC information to generate extrinsic information at each iteration. Such techniques advantageously provide significant gains in memory system performance.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory system, comprising:
a memory device including a super block; and
a memory controller configured to:
perform soft decoding of all word lines in the super block to generate respective codewords and generate soft information as a result of the soft decoding, the super block including multiple word lines and a last word line, which stores a result of an XOR operation on codewords of the multiple word lines;
generate extrinsic information for codewords of failed word lines by scaling respective soft information for each of the failed word lines using a scaling factor specific for each of the failed word lines, wherein the scaling factor is determined based on iteration information and unsatisfied check information for each failed word line;
propagate the extrinsic information across a Tanner graph associated with the XOR operation, wherein the extrinsic information is propagated to check nodes from variable nodes corresponding to the failed word lines and the last word line on the Tanner graph;
update check information based on the propagated extrinsic information to generate updated check information by updating the check nodes based on the propagated extrinsic information; and
perform low-density parity-check (LDPC) decoding of the codewords of the failed word lines with the extrinsic information and the updated check information.

2. The memory system of claim 1, wherein the memory controller generates the scaled extrinsic information for each word line for which soft decoding failed at each iteration.

3. The memory system of claim 2, wherein the scaling factor is determined as a function of a number of iterations performed with respect to the corresponding word line for which soft decoding failed and the number of unsatisfied checks for the corresponding word line for which soft decoding failed a current iteration.

4. The memory system of claim 3, wherein the function has an inverse relationship with the number of unsatisfied checks for the corresponding word line at the current iteration.

5. The memory system of claim 1, wherein the scaling factor for each word line for which soft decoding failed is determined in real time.

6. The memory system of claim 1, wherein the scaling factor for each word line for soft decoding failed is determined heuristically based on simulation results.

7. A memory controller comprising:
a low-density parity-check (LDPC) decoder configured to:
perform soft decoding of all word lines in a super block to generate respective codewords and generate soft information as a result of the soft decoding, the super block including multiple word lines and a last word line, which stores a result of an XOR operation on codewords of the multiple word lines;
generate extrinsic information for codewords of failed word lines by scaling respective soft information for each the failed word lines using a scaling factor specific for each of the failed word lines, wherein the scaling factor is determined based on iteration information and unsatisfied check information for each failed word line;
propagate the extrinsic information across a Tanner graph associated with the XOR operation, wherein the extrinsic information is propagated to check nodes from variable nodes corresponding to the failed word lines and the last word line on the Tanner graph;
update check information based on the propagated extrinsic information to generate updated check information by updating the check nodes based on the propagated extrinsic information; and
perform low-density parity-check (LDPC) decoding of the codewords of the failed word lines with the extrinsic information and the updated check information.

8. The memory controller of claim 7, wherein the LDPC decoder generates the scaled extrinsic information for each word line for which soft decoding failed at each iteration.

9. The memory controller of claim 8, wherein the scaling factor is determined as a function of a number of iterations performed with respect to the corresponding word line for which soft decoding failed and the number of unsatisfied checks for the corresponding word line for which soft decoding failed at a current iteration.

10. A method of decoding, comprising:
performing soft decoding of all word lines in a super block of a memory device to generate respective codewords and generating soft information as a result of the soft decoding, the super block including multiple word lines and a last word line, which stores a result of an XOR operation on codewords of the multiple word lines;
generating extrinsic information for codewords of failed word lines by scaling respective soft information for each the failed word lines using a scaling factor specific for each of the failed word lines, wherein the scaling factor is determined based on iteration information and unsatisfied check information for each failed word line;
propagate the extrinsic information across a Tanner graph associated with the XOR operation, wherein the extrinsic information is propagated to check nodes from variable nodes corresponding to the failed word lines and the last word line on the Tanner graph;
updating check information based on the propagated extrinsic information to generate updated check information by updating the check nodes based on the propagated extrinsic information; and
performing low-density parity-check (LDPC) decoding of the codewords of the failed word lines with the extrinsic information and the updated check information.

11. The method of claim 10, wherein the scaled extrinsic information is generated for each word line for which soft decoding failed at each iteration.

12. The method of claim 11, wherein the scaling factor is determined as a function of a number of iterations performed with respect to the corresponding word line for which soft decoding failed and the number of unsatisfied checks for the corresponding word line for which soft decoding failed at a current iteration.

13. The method of claim 12, wherein the function has an inverse relationship with the number of unsatisfied checks for the corresponding word line at the current iteration.

14. The method of claim 10, wherein the scaling factor for each word line for which soft decoding failed is determined in real time or heuristically based on simulation results.

* * * * *